(12) United States Patent
Poitrast et al.

(10) Patent No.: US 10,263,424 B2
(45) Date of Patent: Apr. 16, 2019

(54) ENERGY MANAGEMENT SYSTEM FOR CONTROLLING ENERGY TO A LOAD POWERED BY A THERMOELECTRIC MODULE

(71) Applicant: LEDdynamics, Inc., Randolph, VT (US)

(72) Inventors: Daniel Miller Poitrast, Randolph, VT (US); Shane Michael Clarke, Island Pond, VT (US)

(73) Assignee: LEDdynamics, Inc., Randolph, VT (US)

(*) Notice: Subject to any disclaimer, the term of this patent is extended or adjusted under 35 U.S.C. 154(b) by 498 days.

(21) Appl. No.: 14/676,770

(22) Filed: Apr. 1, 2015

(65) Prior Publication Data

US 2015/0288187 A1    Oct. 8, 2015

Related U.S. Application Data

(63) Continuation-in-part of application No. 14/508,225, filed on Oct. 7, 2014, now abandoned.

(60) Provisional application No. 61/974,418, filed on Apr. 2, 2014.

(51) Int. Cl.
  *H02J 3/14* (2006.01)
  *H02J 7/00* (2006.01)
  *H01L 35/32* (2006.01)

(52) U.S. Cl.
  CPC ............ *H02J 3/14* (2013.01); *H01L 35/32* (2013.01); *H02J 7/0073* (2013.01); *H02J 7/0077* (2013.01); *Y02B 70/3225* (2013.01); *Y04S 20/222* (2013.01); *Y10T 307/707* (2015.04)

(58) Field of Classification Search
  None
  See application file for complete search history.

(56) References Cited

U.S. PATENT DOCUMENTS

| 4,665,276 | A | * | 5/1987 | Elbel | H01L 35/08 136/214 |
| 5,450,727 | A | * | 9/1995 | Ramirez | F25B 21/02 165/259 |
| 5,705,770 | A | * | 1/1998 | Ogasawara | H02J 7/34 136/205 |
| 5,892,656 | A |   | 4/1999 | Bass | |
| 6,487,865 | B1 | * | 12/2002 | Luo | F25B 21/04 62/259.2 |
| 6,519,949 | B1 | * | 2/2003 | Wernlund | F25B 21/02 372/34 |
| 6,883,929 | B2 |   | 4/2005 | Dowling | |
| 8,400,162 | B1 | * | 3/2013 | Jannson | G01R 31/3651 320/132 |

(Continued)

FOREIGN PATENT DOCUMENTS

WO    2010133814 A1    11/2010

*Primary Examiner* — Sharon E Payne
(74) *Attorney, Agent, or Firm* — Thomas G. Ference

(57) ABSTRACT

An energy management system for controlling energy to one or more loads powered by a thermoelectric module, the system is comprised of a load prioritization circuit having a monitoring system interfaced to receive sensor data from at least one sensor. A data processing device receives the sensor data. The data processing device acts upon the sensor data to produce energy management instructions. A control system receives the energy management instructions using them to control energy to all loads.

32 Claims, 9 Drawing Sheets

Load Prioritization Circuit with Overload Protection with Multiple Loads

(56) References Cited

U.S. PATENT DOCUMENTS

| | | | |
|---|---|---|---|
| 2007/0189026 A1* | 8/2007 | Chemel | H05B 37/029 |
| | | | 362/458 |
| 2009/0205694 A1 | 8/2009 | Huettner et al. | |
| 2011/0155200 A1 | 6/2011 | Simka | |
| 2012/0181971 A1 | 7/2012 | Birkeland et al. | |
| 2012/0226572 A1* | 9/2012 | Park | H02J 3/14 |
| | | | 705/26.1 |
| 2013/0265767 A1 | 10/2013 | Lang | |
| 2014/0183947 A1* | 7/2014 | Chandler | H02J 9/061 |
| | | | 307/23 |

* cited by examiner

US 10,263,424 B2

ENERGY MANAGEMENT SYSTEM FOR CONTROLLING ENERGY TO A LOAD POWERED BY A THERMOELECTRIC MODULE

RELATED APPLICATIONS

This application is a continuation-in-part of U.S. Non-provisional patent application Ser. No. 14/508,225, filed Oct. 7, 2014, which claims the benefit of priority of U.S. Provisional Patent Application No. 61/974,418, filed Apr. 2, 2014, both entitled "Thermally Powered Illumination Device" and both herein incorporated by reference.

FIELD

The present invention generally relates to managing energy generated by thermoelectric modules and thermoelectric generators. More specifically, it relates to an energy management system that prioritizes how electrical energy generated by the thermoelectric module(s) is distributed between various loads.

BACKGROUND

Thermoelectric generators are becoming popular as backup sources of electricity to power electronic devices when traditional power sources are unavailable or wired grids go down. A thermoelectric generator includes a thermoelectric module with associated components for cooling the module, regulating power out, storing power and delivering power to various electronic devices. A variety of loads, such as heat-removing systems, energy storage devices, and electronics to be operated may be integrated to draw upon the electric energy created. Another aspect is availability of operational data such as thermoelectric module data and sensor data that could be harvested with a data logging system and stored in a data processing device and locally or remotely accessed. Thermoelectric generators work more efficiently when coupled to high thermal output devices such as wood and gas stoves, fireplaces, etc.

Traditional thermoelectric generators rely on matching the output voltage of the thermoelectric generator to that of the load. The voltage and current of the generator come up together when connected to a heat source. Only after the output potential of the generator has achieved a potential greater than the resting voltage of the energy storage device or greater than the minimum voltage to power the load will it start to power the load. Most thermoelectric generators are designed to run on high temperature heat sources (i.e., 450° C. max temp). These generators struggle to even trickle charge an energy storage device at lower temperatures as their output voltage may be only a fraction of what would be necessary to charge the device. Having a system that can prioritize usage of generated electrical energy and convert overall electrical energy output from the thermoelectric module would be of benefit.

The present invention aims to provide a system for effectively charging energy storage devices at lower potential electrical energies while managing/prioritizing power used by all loads including active cooling devices for heat-exiting sides of the thermal electric generator. The system also regulates overloading of the thermoelectric modules and the active cooling system to prevent the components or parts of the internal and external system from being damaged.

SUMMARY

One aspect of the present invention is an energy management system for controlling energy to a load powered by a thermoelectric module. The system is comprised of a monitoring system interfaced to receive sensor data from at least one sensor. A data processing device receives the sensor data. The data processing device acts upon the sensor data with an optimizing algorithm to produce energy management instructions. A control system receives the energy management instructions using them to control energy to all loads.

Another aspect of the present invention is a method for controlling a thermoelectric device. The method includes providing a thermoelectric module, a heat-receiving system to remove heat from the thermoelectric module and a load to draw power from the thermoelectric module. The method then includes measuring module characteristics of the thermoelectric module and prioritizing electrical energy distribution between the heat-removing system and the load.

BRIEF DESCRIPTION OF DRAWINGS

The foregoing and other aspects and advantages of the invention presented in this disclosure will be apparent from the following detailed description, as illustrated in the accompanying drawings, in which.

DETAILED DESCRIPTION

Figure 1:
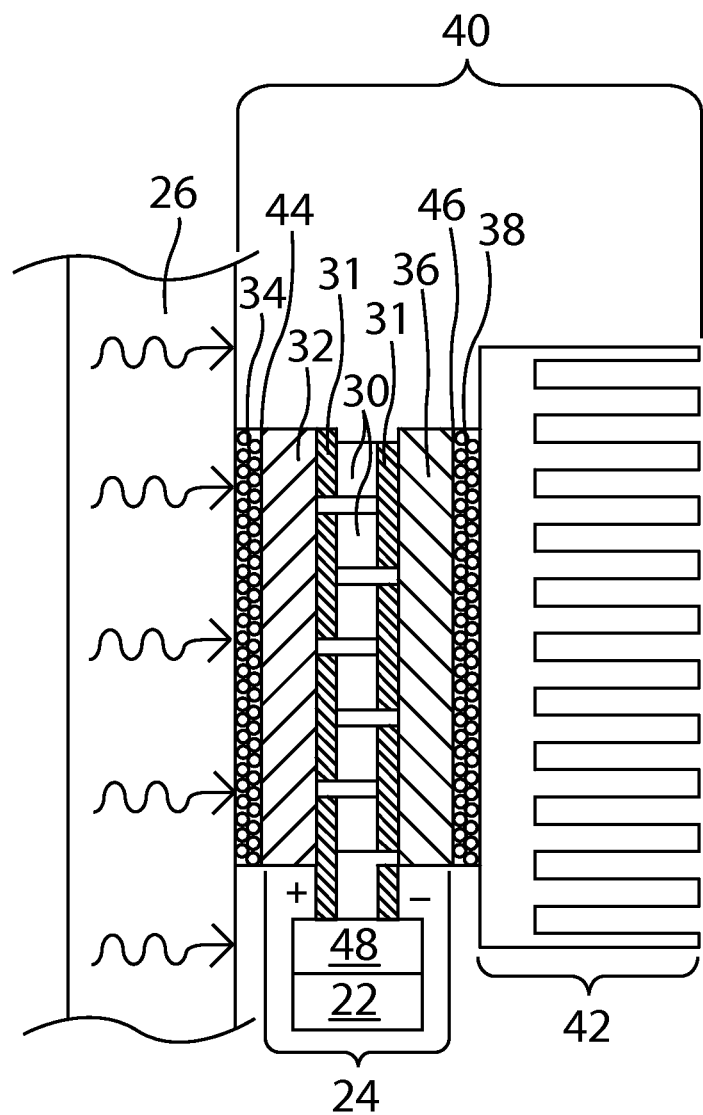
FIG. 1 is a schematic diagram of a section through a thermoelectric module showing various features of a thermoelectric module and associated components that may be used in conjunction with the present invention shown in FIGS. 2-9.

FIGS. 1-9 show various aspects of energy management system 20 for controlling energy to a load 22 powered by a thermoelectric module 24. Thermoelectric module (TEM) 24 generates electrical energy when interfaced with a heat source 26. Heat source 26 may be a wood stove, gas stove, fireplace or other heat generating device. Thermoelectric module 24 includes thermoelectric elements 30. Thermoelectric elements 30 are p-type and n-type semiconductor elements that are heavily doped with electrical carriers. Thermoelectric elements 30 are connected in series by connections 31. Operation of thermoelectric module 24 is based on the Seebeck effect. The Seebeck effect is the conversion of energy from temperature differences directly into electricity. Thermoelectric module 24 further includes a heat-receiving element 32 having a heat-receiving interface 34 for thermoelectric elements 30. Thermoelectric module 24 further comprises a heat-exiting element 36 having a heat-exiting interface 38. Heat-receiving element 32 and heat-exiting element 36 may be a substrate such as a metal plate ceramic, etc. Together thermoelectric elements 30, heat-receiving element 32 and heat exiting element 36 create thermoelectric module 24, FIG. 1. Thermoelectric module 24 harvests heat to generate electric current. Electric current generated can be used to power any type of electrical device, electrical energy storage device, heat-removing system or sensor. Any of these devices or sensors represent a load 22 powered by thermoelectric module 24.

For example, load 22 may be an energy storage device charge controller in which energy management system 20 may be used to determine in conjunction with energy storage device charge controller what type of energy storage devices are being charged, how many energy storage devices are being charged, what chemistries are being charged, and how best to optimize the output energy of TEM 24 and the overall system to provide optimum energy storage device charging. Energy storage device charge controller may charge various energy storage device chemistries and determine which chemistry of battery bank and how many cells are connected. Energy storage device chemistries may be at least one from the group consisting of lithium ion, LiFePO4, NiMH, lead acid, sealed lead acid or capacitor.

For a thermoelectric module 24 to become a thermoelectric generator (TEG) 40 and continuously generate electricity, some sort of heat-removing system 42 is required to keep a temperature difference between heat-receiving side 44 (a.k.a heat-receiving surface) and heat-exiting side 46 (a.k.a. heat-exiting surface) of thermoelectric module 24, FIG. 1. Heat-removing system may be a passive heat-removing system or an active heat-removing system. Heat-removing system 40 may be an air cooling system or a water cooling system. The air cooling system may be either an active cooling system such as a fan or a passive cooling system such as a heat sink with cooling fins. The water cooling system may be an active water pumping system or vessel holding water. A variety of electric elements 48 (i.e., monitoring system 50, control system 58, load prioritization circuit 66, etc.) may be integrated with the thermoelectric generator to control electrical output. Still other electric elements (a.k.a. loads 22) may be connected to operate from electrical energy generated by thermoelectric generator 40. For example, thermoelectric generator 40 may power sensors such as: temperature, magnetic fields, gravity, humidity, moisture, vibration, pressure, electrical fields, sound and chemical sensors. Thermoelectric generator 40 may power or include wireless devices/interfaces such as: transceivers, receivers and transmitters including BLUETOOTH®, ZIGBEE®, etc. Thermoelectric generator 40 may have connected power regulation devices such as: USB ports and a battery charger. Thermoelectric generator 40 may also power external devices such as: LED lights, fans and radios.

Figure 2:
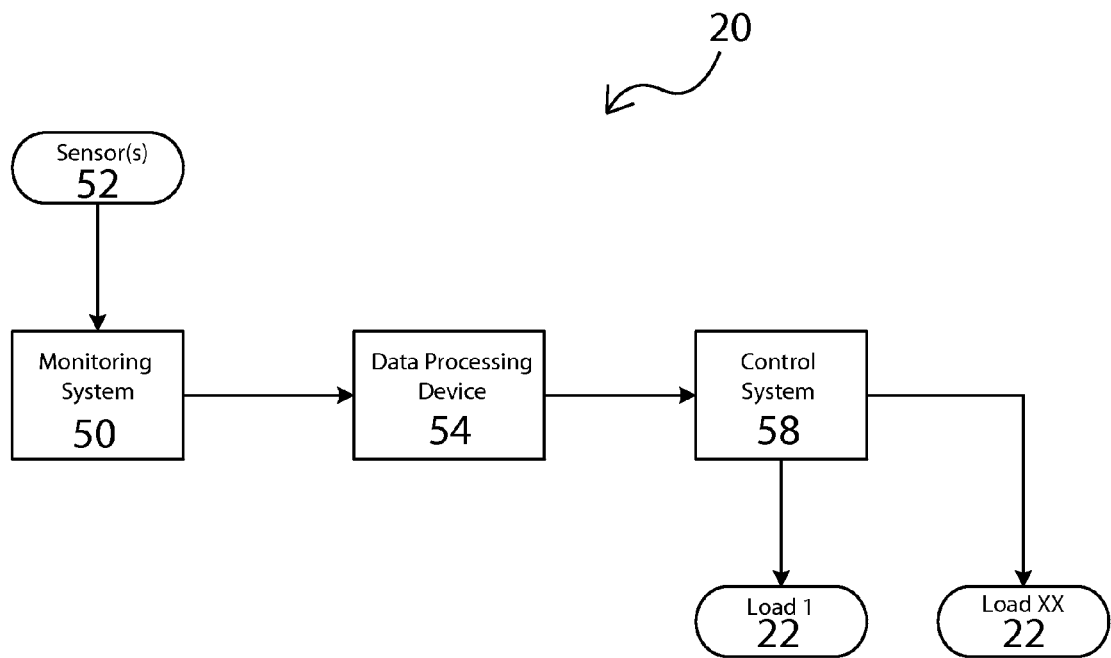
FIG. 2 is a schematic diagram showing various elements that make up the energy management system for controlling energy to a load powered by a thermoelectric module.

FIG. 2 diagrams energy management system 20 for controlling energy to one or more loads 22 powered by a thermoelectric module 24. Energy management system 20 comprises monitoring system 50 interfaced to receive sensor data from at least one sensor 52. Energy management system 20 further comprises data processing device 54 that receives sensor data from sensor 52. Sensor data may be accessed remotely. Sensor(s) 52 send real-time sensor data to monitoring system 50 via a wired or wireless connection. Power for sensors 52 can be supplied from monitoring system 50 or from an independent supply. The monitoring system 50 then transmits the sensor data received from sensors 52 to data processing device 54 via a wired or wireless connection. Data processing device 54 acts upon the sensor data with programmed logic and/or algorithms to prioritize and adjust output electrical energy to one or more of loads 22. Optimizing algorithm 56 produces energy management instructions. Energy management instructions are transmitted from data processing device 54 and received by control system 58 via a wired or wireless connection. Control system 58 applies the instructions made by data processing device 54 to loads 22 that are connected to energy management system 20 thereby controlling energy to the loads. For example, control system may control energy to heat-removing system 42. Energy management instructions can vary from turning a load on and off to other more complex control schemes such as varying the power to the loads.

Energy management system 20 maybe an independent system that controls thermoelectric module 24 or the energy management system may include other components. For example, energy management system 20 may comprise the thermoelectric module which is producing the electrical energy. Energy management system 20 may further comprise heat-removing system 42. Energy management system 20 may also include maximum power circuit 60, one or more power converters 62, voltage rail 64 and load prioritization circuit 66. Heat-removing system 42 may act as one of the loads 22 and be controlled by energy management system 20. Energy management system 20 may comprise any of the loads 22 as part of the system.

Figure 3:
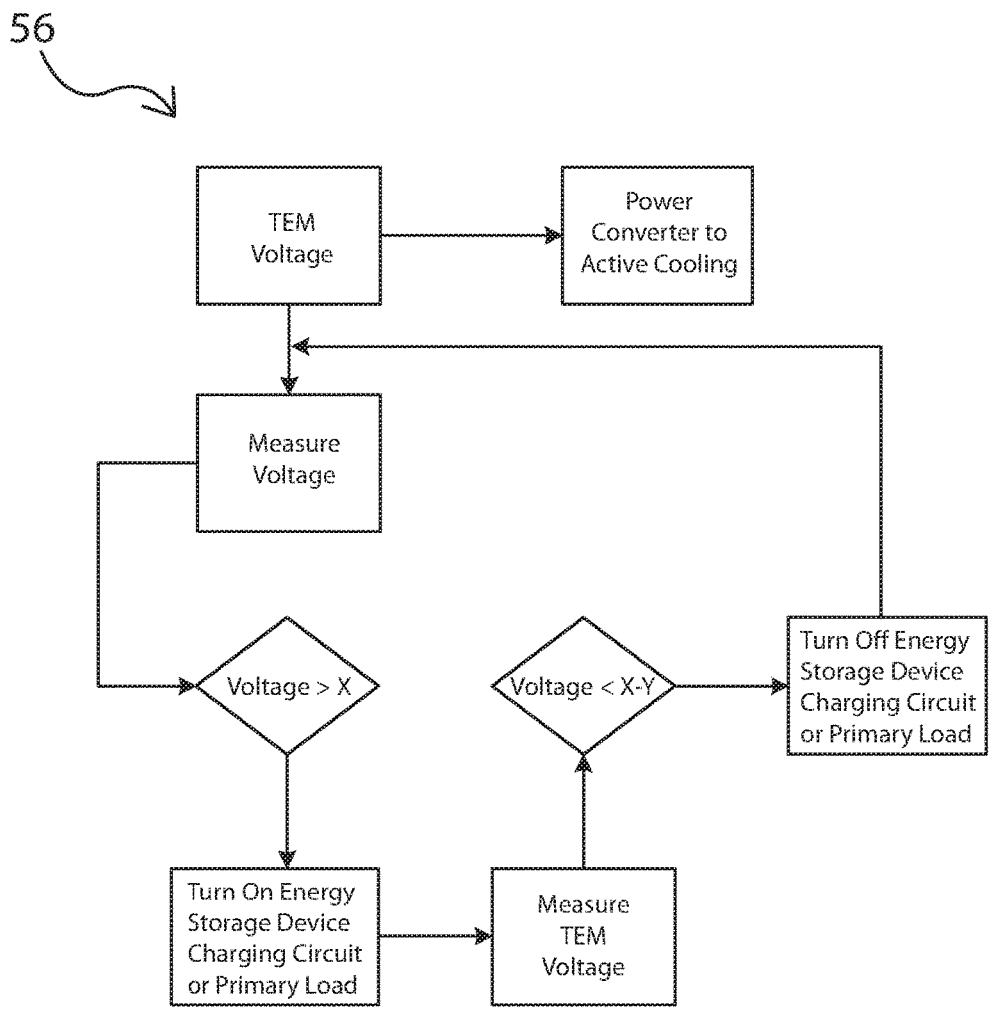
FIG. 3 is a schematic diagram showing a monitoring system with a single load that may be implemented with the energy management system shown in FIG. 2.

FIG. 3 depicts an algorithm 56 for a monitoring system 50 with a single load 22. The algorithm ensures that a TEM's maximum temperature is not exceeded while supplying power to load 22. Upon startup the TEM voltage is measured. This occurs by a voltage sensor that detects voltage from the output of TEM 24. If the voltage is greater than set point X, then load 22 is supplied power from TEM 24. Once load 22 is given power the TEM voltage is monitored. When the monitored voltage is lower than threshold X-Y load 22 is disconnected. The hysteretic logic ensures the TEM voltage, upon being loaded, does not automatically trigger a load disconnect event, while still supplying enough power for the active cooling system to regulate the temperature (heat-receiving side temperature and/or heat-exiting side temperature) of TEM 24.

Figure 4:
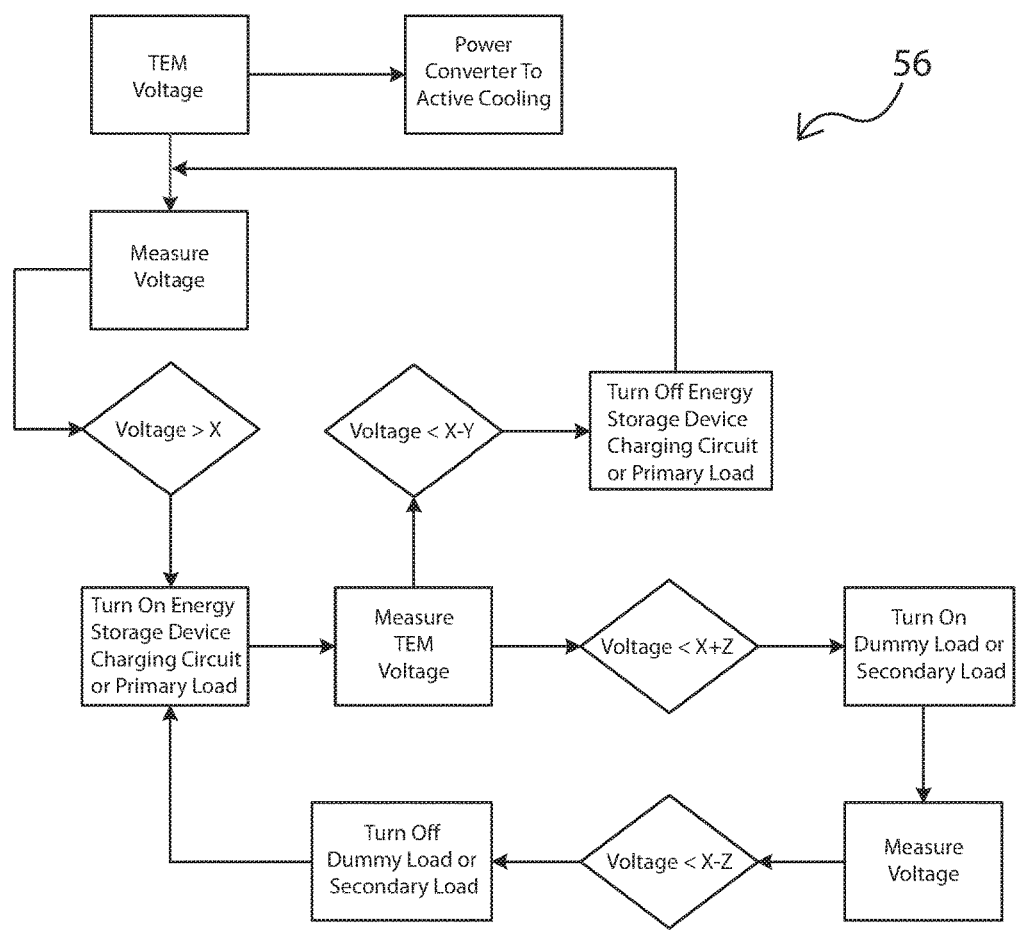
FIG. 4 is a schematic diagram of a monitoring system showing a load priority circuit with over load protection for multiple loads that may be implemented with the energy management system shown in FIG. 2.

FIG. 4 depicts an algorithm 56 for monitoring system 50 with multiple loads 22. The algorithm ensures a TEM's maximum temperature (heat-receiving side temperature and/or heat-exiting side temperature) is not exceeded while prioritizing power to multiple loads 22. Upon startup the TEM voltage is measured, if the voltage is greater than set point X the primary load is connected to TEM 24. Once the primary load is given power from TEM 24 the TEM's loaded voltage is measured, if the TEM's loaded voltage is below set point X-Y the load is disconnected, if the TEM's loaded voltage is above set point X+Z the secondary load is also given power from the TEM. Once the second load is connected the loaded TEM voltage is monitored. Once the TEM loaded voltage is below set point X−Z the second load is no longer given power from the TEM, and the voltage is again monitored for condition of the loaded TEM voltage being less then X−Y or greater then X+Z. FIG. 4 only depicts two loads, but an infinite amount of loads 22 could be connected following a similar logic. The hysteretic logic ensures the TEM voltage, upon being loaded, does not automatically trigger a load disconnect event, while still supplying enough power for the active cooling system to regulate the temperature of the TEM.

Figure 5:
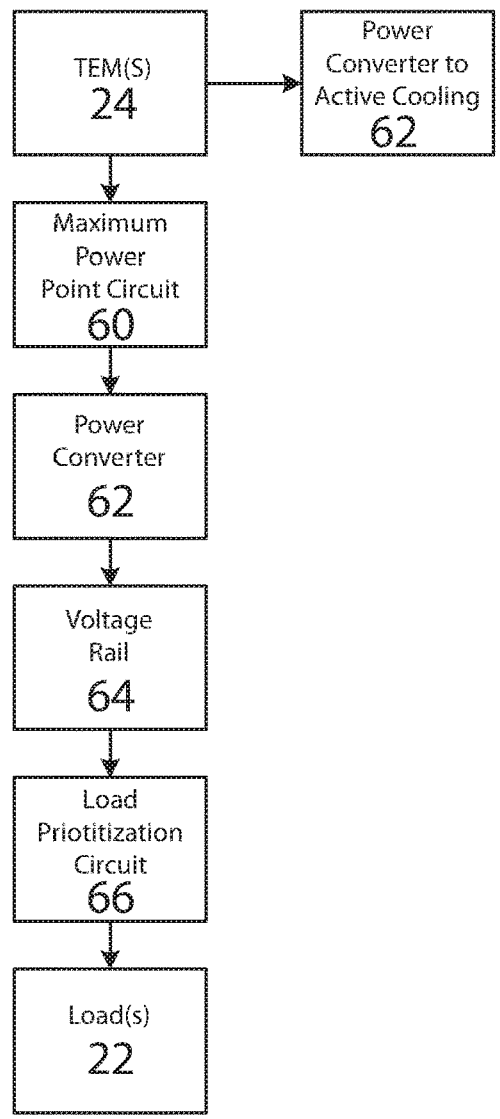
FIG. 5 is a schematic diagram showing various additional elements that may be integrated with the energy management system shown in FIG. 2.

FIG. 5 depicts the system integration diagram for energy management system 20. This integration diagram shows how subsystems are interconnected. TEM(s) 24 have two possible connections one being connection to an active cooling system 42, and another to a maximum power point control circuit 60. Maximum power point control circuit 60 is connected directly to a power converter 62. Power converter 62 is at least one from the group consisting of a buck, buck-boost, SEPIC, linear regulator or boost converter. Power converter 62 conditions the power from maximum power point control circuit 60 in order to prepare the power for loads 22. Power to loads 22 can be supplied from a voltage rail 64 or directly from power converter 62. Power converter 62 supplies conditioned power to load prioritization circuit 66. Load prioritization circuit 66 measures the TEM's characteristics, and makes decisions as to where and when power will be supplied to the load(s) 22.

Figure 6:
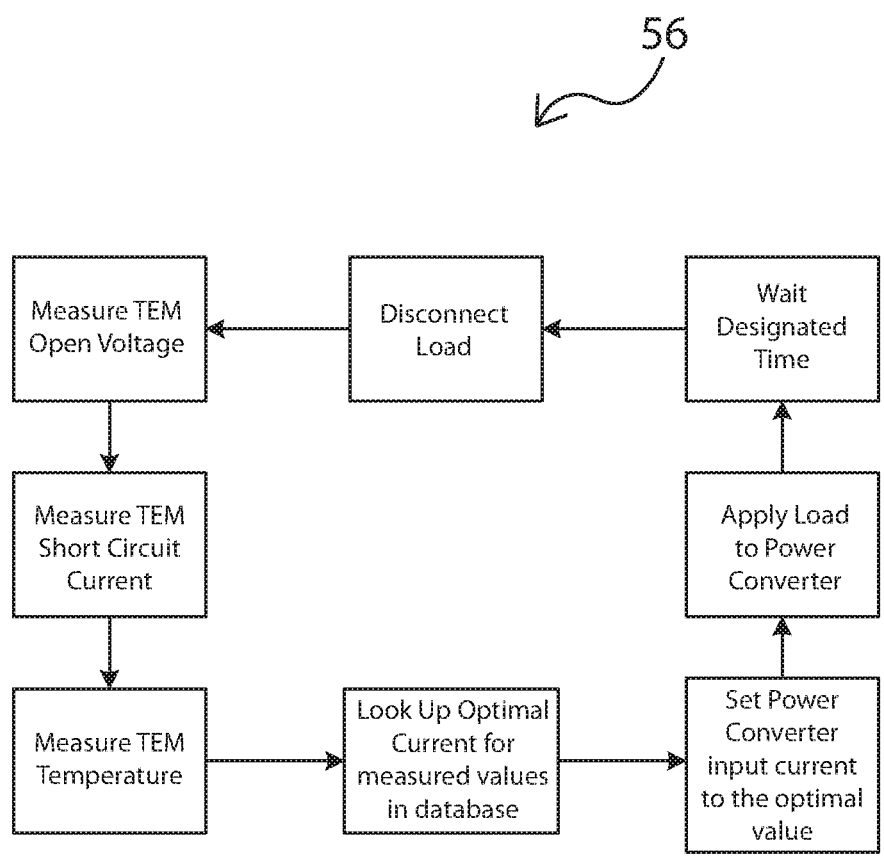
FIG. 6 is a schematic diagram showing a maximum power point converter as a look up table that represents one embodiment of an algorithm used in conjunction with the energy management system shown in FIG. 2.

FIG. 6 depicts a maximum power point converter look up table algorithm 56. Data processing device 54 uses look up table algorithm 56 to determine maximum output for the TEM 24. Initially, the TEM open circuit voltage, TEM short circuit current, and TEM temperature are measured are measured, respectively, using a voltage sensor, current sensor and temperature sensor monitoring TEM 24. Voltage sensor, current sensor and temperature sensor monitoring TEM 24 are thermoelectric sensing elements. The temperature sensor may detect the temperature of the heat-receiving side and/or the heat-exiting side of TEM 24. The aforementioned measurements are then compared to a lookup table. The lookup table has optimal input current associated with the measured parameters. The optimal input current is then applied to a power converter, which powers a load. Once the load is powered a designated load on-time elapses. The designated on-time is applied to ensure the TEM has adequate time to stabilize. After stabilization the load is disconnected and the cycle starts again. The algorithm ensures maximum power point on a cycle by cycle basis.

Energy management system 20 is used to control a thermoelectric device by various methods. A thermoelectric device is any device that includes a thermoelectric module 24. These methods are implemented by first providing a thermoelectric module 24, a heat-removing device to remove heat from the thermoelectric module, and a load to draw power from the thermoelectric module. The method then involves measuring module characteristics of the thermoelectric module. The method also involves prioritizing electrical energy distribution between heat-receiving system 42 and load 22. The method may further include measuring heat-removing characteristics of heat-removing system 42 and measuring load characteristics of load 22. As part of the method, an active heat-removing system may be provided. During prioritization, the active heat-removing system receives an amount of energy to cool thermoelectric module 24 at or below a maximum hot-side temperature, or at or below a maximum cool-side temperature. The amount of electrical energy the active heat-removing device receives is the amount to maximize output power of thermoelectric module 24. Energy management system 20 monitors and changes priority of the electrical energy distribution between the heat-removing system and the load.

Electrical energy distribution decisions and or priority are determined using an algorithm. Algorithm 56 is processed through data processing device 54 using sensor data of module characteristics such as: load current, short circuit current, open circuit voltage, load voltage, and temperature. Based upon algorithm 56 electrical energy distribution is given priority to active heat-removing system 42 over all other loads. The basis of these decisions is to ensure TEM 24 operates in optimal power output conditions, or is not damaged by an over temperature event.

Figure 7:
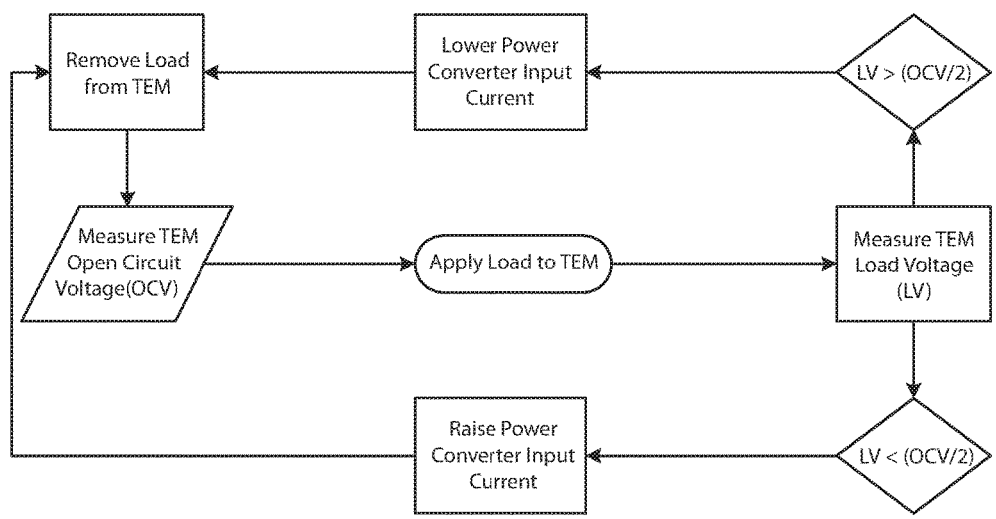
FIG. 7 is a schematic diagram showing a thermoelectric module maximum power point tracker OCV/2 method that represents one embodiment of an algorithm used in conjunction with the energy management system shown in FIG. 2.

FIG. 7 depicts a maximum power point tracker using a half open circuit voltage method. Initially, the TEM open circuit voltage (OCV) is measured. Additionally, temperature of the TEM may be measured. The temperature sensor may detect the temperature of the heat-receiving side and/or the heat-exiting side of TEM 24 where this sensor data is monitored by monitoring system 50. Load 22 is then applied to TEM 24. After load 22 is applied, a TEM load voltage (LV) is measured. If LV is greater than OCV/2, then the input current to the power converter is decreased, whereas if LV is lower than OCV/2 then the input current is increased. After the input current is changed from either of the two logic states the entire process begins again. Control system 58 turns on and off load 22 to control at least one from the group consisting of the heat-receiving side temperature and the heat-exiting side temperature. The aforementioned logic will adjust the power drawn from TEM 24 in a cycle by cycle basis to optimize the power from the TEM, the temperature of the TEM and determine the maximum power point voltage.

Figure 8:
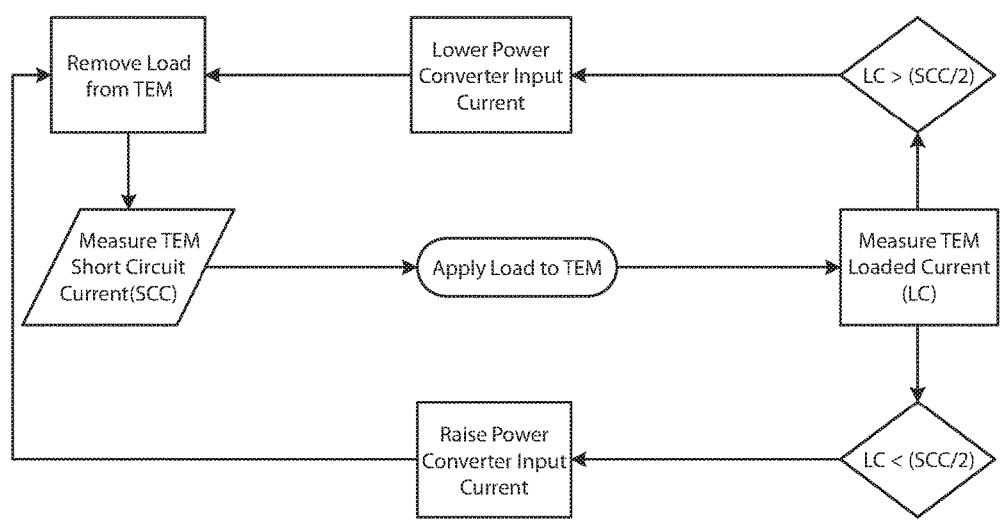
FIG. 8 is a schematic diagram showing a thermoelectric module maximum power point tracker SCC/2 method that represents one embodiment of an algorithm used in conjunction with the energy management system shown in FIG. 2.

FIG. 8 depicts a maximum power point tracker using a half short circuit current method. Initially, the TEM short circuit current (SCC) is measured. Load 22 is then applied to TEM 24. After load 22 is applied, a TEM loaded voltage (LV) is measured. If LV is greater than SCC/2, then the input current to the power converter is decreased, whereas if LV is lower than SCC/2 then the input current is increased. After the input current is changed from either of the two logic states the entire process begins again. The aforementioned logic will adjust the power drawn from TEM 24 in a cycle by cycle basis to optimize the power from the TEM, the temperature of the TEM and determine the maximum power point current.

Figure 9:
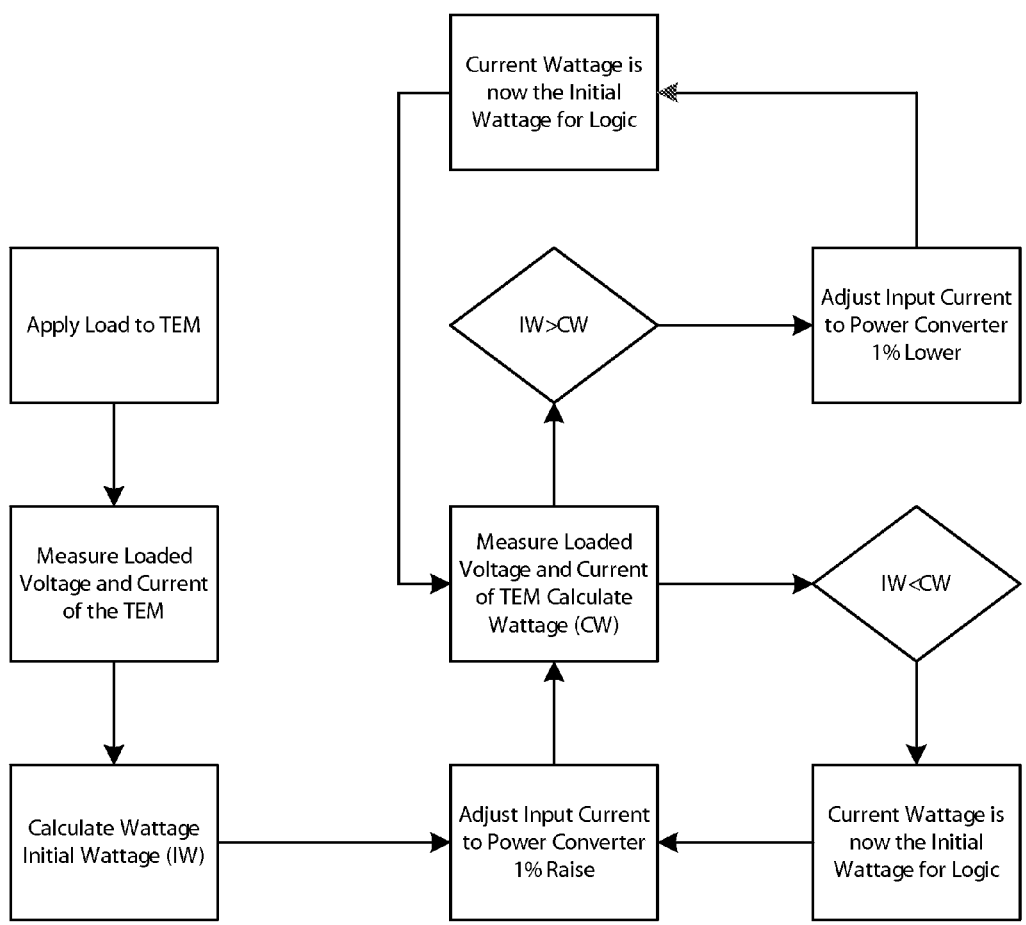
FIG. 9 is a schematic diagram showing a maximum power point converter as an iterative process that represents one embodiment of an algorithm used in conjunction with the energy management system shown in FIG. 2.

FIG. 9 depicts a maximum power point converter using an iterative method. Initially, load 22 is applied to TEM 24. Once load 22 is applied, the loaded voltage and current is measured. The loaded voltage and current is used to determine the initial wattage (IW). The input current from TEM 24 is then raised a percentage, and the loaded voltage and current are measured again to determine the calculated wattage (CW). If IW is greater than CW, then the input current from TEM 24 is lowered a percentage. After the current adjustment is made, CW then becomes IW. If IW is less than CW, than the input current from TEM 24 is raised a percentage. After the current adjustment is made CW then becomes IW. Once CW has become IW, another CW is measured and the IW to CW comparison starts again. The iterative method ensures the maximum amount of wattage is drawn from the TEM by sampling and adjusting the current drawn from the TEM while under a load.

While several embodiments of the invention, together with modifications thereof, have been described in detail herein and illustrated in the accompanying drawings, it will be evident that various further modifications are possible without departing from the scope of the invention. The scope of the claims should not be limited by the preferred embodiments set forth in the examples, but should be given the broadest interpretation consistent with the description as a whole.

What is claimed is:

1. A method for controlling a thermoelectric device, comprising:
   a) providing a thermoelectric module configured to generate electrical power, an independent active heat-removing system powered by said thermoelectric module to remove heat primarily from said thermoelectric module, a load to draw power from said thermoelectric module, a thermoelectric sensing element to measure module characteristics, and a load prioritization circuit to regulate power between said active heat-removing system and said load;
   b) measuring said module characteristics of said thermoelectric module with said thermoelectric sensing element;
   c) inputting said module characteristics to said load prioritization circuit to generate instructions for how the electrical power should be distributed between the active heat-removing system and the load to maximize the electrical power output generated by said thermoelectric module; and
   d) having said load prioritization circuit use said instructions to prioritize electrical energy distribution between said active heat-removing system and said load to maximize the electrical power generated by said thermoelectric module.

2. The method as recited in claim 1, further comprising measuring heat-removing characteristics of said active heat-removing system.

3. The method as recited in claim 1, further comprising measuring load characteristics of said load.

4. The method as recited in claim 1, wherein during said step d) said active heat-removing system receives an amount of energy generated by the thermoelectric module to cool said thermoelectric module at or below a maximum hot-side temperature.

5. The method as recited in claim 1, wherein during said step d) said active heat-removing system receives an amount of energy generated by the thermoelectric module to cool said thermoelectric module at or below a maximum cool-side temperature.

6. The method as recited in claim 1, wherein during said step d) said active heat-removing system receives an amount of energy generated by the thermoelectric module to cool said thermoelectric module so as to maximize output power of the thermoelectric module.

7. The method as recited in claim 1, wherein during step b) module characteristics of current, voltage and temperature are measured; wherein during step c) said module characteristics are processed through said load prioritization circuit making decisions to prioritize power to said active heat removing device.

8. The method as recited in claim 1, wherein during step b) module characteristics of open-voltage, short circuit current, and temperature are measured; wherein during step c) said module characteristics are processed through said load prioritization circuit determining maximum power point voltage and current.

9. The method as recited in claim 1, wherein during step b) a module characteristic of open circuit voltage is measured; wherein during step c) said open circuit voltage is processed through said load prioritization circuit determining maximum power point voltage.

10. A The method as recited in claim 1, wherein during step b) a module characteristic of short circuit current is measured; wherein during step c) said short circuit current is processed through said load prioritization circuit determining maximum power point current is determined.

11. A The method as recited in claim 1, wherein during step b) a module characteristic of loaded voltage is measured; wherein during step c said loaded voltage is processed through said load prioritization circuit to determine how said electrical energy distribution is prioritized between said heat-removing system and said load.

12. An A thermoelectric energy management system for controlling energy to one or more loads, comprising:
   a) a thermoelectric module having at least one thermoelectric element, said thermoelectric module having a heat-receiving side and a heat-exiting side, said thermoelectric module configured to generate electrical power;
   b) an active heat-removing system thermally coupled to said heat-exiting side of said thermoelectric module, said active heat-removing system configured to operate from electrical power that is generated by said thermoelectric module;
   c) at least one thermoelectric sensing element connected to the thermoelectric module to sense module characteristics of said thermoelectric module;
   d) a load prioritization circuit electrically connected to said active heat-removing system and the one or more loads, said at least one thermoelectric sensing element providing sensor data to said load prioritization circuit; and
   e) wherein said load prioritization circuit prioritizes the generated electrical power generated by said thermoelectric module between said active heat-removing system and the one or more loads.

13. The thermoelectric energy management system as recited in claim 12, further comprising a power converter between said thermoelectric module and the loads.

14. The thermoelectric energy management system as recited in claim 13, wherein said power converter supplies voltage to a voltage rail.

15. The thermoelectric energy management system as recited in claim 13, wherein said power converter is at least one from the group consisting of a buck, buck-boost, SEPIC, linear regulator or boost converter.

16. The thermoelectric energy management system as recited in claim 12, further comprising of a wireless interface that is at least one from the group consisting of Bluetooth, WiFi or ZigBee; wherein said sensor data is accessed remotely.

17. The thermoelectric energy management system as recited in claim 12, further comprising the load; wherein the load is an energy storage device charge controller.

18. The thermoelectric energy management system as recited in claim 17, wherein said energy storage device charge controller charges various energy storage device chemistries; wherein said various battery chemistries are at least one from the group consisting of lithium ion, LiFePO4, NiCd, NiMH, lead acid and sealed lead acid.

19. The thermoelectric energy management system as recited in claim 17, wherein said energy storage device charge controller determines chemistry of a battery bank connected to said energy storage device charge controller.

20. The thermoelectric energy management system as recited in claim 17, wherein said energy storage device charge controller determines how many cells are connected.

21. The thermoelectric energy management system as recited in claim 12, wherein said at least one thermoelectric sensing element is a voltage sensor that detects voltage generated directly from said thermoelectric module.

22. The thermoelectric energy management system as recited in claim 12, wherein said at least one thermoelectric sensing element is a current sensor that detects current generated directly from said thermoelectric module.

23. The thermoelectric energy management system as recited in claim 12, wherein said at least one thermoelectric sensing element is a temperature sensor.

24. The thermoelectric energy management system as recited in claim 23, wherein said temperature sensor detects temperature of said heat-receiving surface of said thermoelectric module.

25. The thermoelectric energy management system as recited in claim 23, wherein said temperature sensor detects temperature of said heat-exiting surface of said thermoelectric module.

26. The thermoelectric energy management system as recited in claim 12, wherein said sensor data includes an open circuit voltage of said thermoelectric module, a short circuit current of said thermoelectric module, and at least one temperature from the group consisting of a heat-receiving surface temperature and a heat-exiting surface temperature of said thermoelectric module; wherein said load prioritization circuit determines a maximum output for said thermoelectric module based on said open circuit voltage, said short circuit current and at least one temperature from the group consisting of said heat-receiving surface temperature and said heat-exiting surface temperature.

27. The thermoelectric energy management system as recited in claim 26, wherein said data processing device uses a lookup table.

28. The thermoelectric energy management system as recited in claim 12, wherein said sensor data is a load voltage of the thermoelectric module; wherein said monitoring system measures at least one temperature from the group consisting of a heat-receiving surface temperature and a heat-exiting surface temperature of said thermoelectric module, wherein said load prioritization circuit turns on and off at least one from the group consisting of said active heat-removing system and the one or more loads to control said at least one temperature from the group consisting of said heat-receiving surface temperature and said heat-exiting surface to a defined set point.

29. The thermoelectric energy management system as recited in claim 12, further comprising a data processing device adapted to receive the sensor data and configured to generate energy management instructions.

30. The thermoelectric energy management system as recited in claim 29, wherein said load prioritization circuit is adapted to receive the energy management instructions from said data processing device.

31. The thermoelectric energy management system as recited in claim 29, further comprising a data logging system, wherein said data processing device stores said sensor data.

32. A method for controlling energy between an active heat-removing system and one or more loads that are all powered by a thermoelectric module, comprising:
   a) providing a load prioritization circuit having a data processing device and a control system;
   b) measuring with said load prioritization circuit module characteristics of the thermoelectric module that is generating power;
   c) analyzing with said data processing device said module characteristics and generating energy management instructions within said data processing device for how the generated power should be distributed between the active heat-removing system and the load to maximize electrical power output generated by the thermoelectric module;
   d) reading with said control system said energy management instructions; and
   e) e) prioritizing through said control system power use between the active cooling system and the loads to maximize the electrical power output of the thermoelectric module.

* * * * *